United States Patent
Usami et al.

(10) Patent No.: US 8,736,051 B2
(45) Date of Patent: May 27, 2014

(54) SEMICONDUCTOR DEVICE AND MANUFACTURING METHOD THEREOF

(71) Applicant: Renesas Electronics Corporation, Kawasaki (JP)

(72) Inventors: Tatsuya Usami, Kanagawa (JP); Tomoyuki Nakamura, Kanagawa (JP); Naoki Fujimoto, Tsuruoka (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/767,446

(22) Filed: Feb. 14, 2013

(65) Prior Publication Data
US 2013/0249084 A1    Sep. 26, 2013

(30) Foreign Application Priority Data
Mar. 23, 2012 (JP) ................ 2012-066739

(51) Int. Cl.
*H01L 23/48* (2006.01)

(52) U.S. Cl.
USPC ........... 257/737; 438/778; 438/780; 438/781; 438/789; 257/258; 257/259; 257/260

(58) Field of Classification Search
None
See application file for complete search history.

(56) References Cited

U.S. PATENT DOCUMENTS 6,479,110 B2 * 11/2002 Grill et al. ................. 427/577
7,202,564 B2    4/2007 Nguyen et al.

FOREIGN PATENT DOCUMENTS

| JP | 2006-237278 A | 9/2006 |
|---|---|---|
| JP | 2008-530821 T | 8/2008 |

* cited by examiner

*Primary Examiner* — Kyoung Lee
(74) *Attorney, Agent, or Firm* — Miles & Stockbridge P.C.

(57) ABSTRACT

A semiconductor device includes an interlayer insulating film containing Si, O, C, and H, an under-bump metal film disposed over the interlayer insulating film and containing Ni, and a bump electrode disposed over the under-bump metal film. In the interlayer insulating film, a ratio of a peak height of Si—$CH_3$ near a wave number 1270 $cm^{-1}$ to a peak height of Si—O near a wave number 1030 $cm^{-1}$ obtained by Fourier-transform infrared spectroscopy (FTIR) is 0.15 or greater and 0.27 or less. A ratio of a peak height of Si—$CH_2$—Si near a wave number 1360 $cm^{-1}$ to the peak height of Si—$CH_3$ near the wave number 1270 $cm^{-1}$ is 0.031 or greater.

8 Claims, 7 Drawing Sheets

Si-CH₃ BONDING MODEL

Si-CH₂-Si BONDING MODEL

SEMICONDUCTOR DEVICE AND MANUFACTURING METHOD THEREOF

CROSS-REFERENCE TO RELATED APPLICATIONS

The disclosure of Japanese Patent Application No. 2012-066739 filed on Mar. 23, 2012 including the specification, drawings and abstract is incorporated herein by reference in its entirety.

BACKGROUND

The present invention relates to a semiconductor device and a manufacturing method thereof.

To improve the reliability of semiconductor apparatuses, various semiconductor device structures have been proposed in recent years.

Japanese Unexamined Patent Application Publication (Translation of PCT Application) No. 2008-530821 discloses a dielectric material serving as an interlayer insulating film of a semiconductor device as described below. The dielectric material contains Si, C, O, and H atoms and has a three-dimensional network structure. The peak area regarding the expansion or contraction of $CH_2$ or $CH_3$, the expansion or contraction of SiH, and a $SiCH_3$ bond obtained by Fourier transform infrared spectroscopy (FTIR) falls within a predetermined range standardized by the thickness of the dielectric film. The porosity of the dielectric material exceeds 20%. For this reason, it is believed that a low-permittivity dielectric film exhibiting good electronic and mechanical properties can be provided.

Japanese Unexamined Patent Publication No. 2006-237278 discloses a semiconductor device including a bump electrode as described below. The semiconductor device includes a pad electrode, an under-bump metal film, and an Au bump electrode. The under-bump metal film includes a TiW film and an Au film. The thicknesses of the TiW and Au films of the under-bump metal film meet a predetermined formula. For this reason, it is believed that occurrence of cracks in the under-bump metal film in a flip chip bonding step can be controlled.

SUMMARY

Stress applied to an electrode may cause defects such as cracks in an interlayer insulating film below the electrode. Addressing this problem is believed to require an interlayer insulating film which is resistant to the stress applied to the electrode and has high strength. Other problems and novel features will be clarified from the description of this specification and the accompanying drawings.

A semiconductor device according to a first aspect of the present invention includes an interlayer insulating film containing Si, O, C, and H, an under-bump metal film containing Ni disposed over the interlayer insulating film, and a bump electrode disposed over the under-bump metal film. In the interlayer insulating film, a ratio of a peak height of Si—$CH_3$ near a wave number 1270 $cm^{-1}$ to a peak height of Si—O near a wave number 1030 $cm^{-1}$ is 0.15 or greater and 0.27 or less. A ratio of a peak height of Si—$CH_2$—Si adjacent to a wave number 1360 $cm^{-1}$ to a peak height of Si—$CH_3$ adjacent to the wave number 1270 $cm^{-1}$ is 0.031 or greater. The ratios are obtained by FTIR.

A method for manufacturing a semiconductor device according to a second aspect of the present invention includes the steps of forming an interlayer insulating film containing Si, O, C, and H (interlayer insulating film formation step), forming an under-bump metal film containing Ni over the interlayer insulating film, and forming a bump electrode over the under-bump metal film. In the interlayer insulating film formation step, a ratio of a peak height of Si—$CH_3$ near a wave number 1270 $cm^{-1}$ to a peak height of Si—O near a wave number 1030 $cm^{-1}$ is 0.15 or greater and 0.27 or less, and a ratio of a peak height of Si—$CH_2$—Si near a wave number 1360 $cm^{-1}$ to a peak height of Si—$CH_3$ near the wave number 1270 $cm^{-1}$ is 0.031 or greater. The ratios are obtained by FTIR.

According to the first aspect of the present invention, a semiconductor device can be provided that includes an interlayer insulating film having a high strength.

DETAILED DESCRIPTION

Now, embodiments of the present invention will be described with reference to the accompanying drawings. Like components are given like reference signs through the drawings, and descriptions thereof will be omitted as appropriate.

First Embodiment

Figure 1:
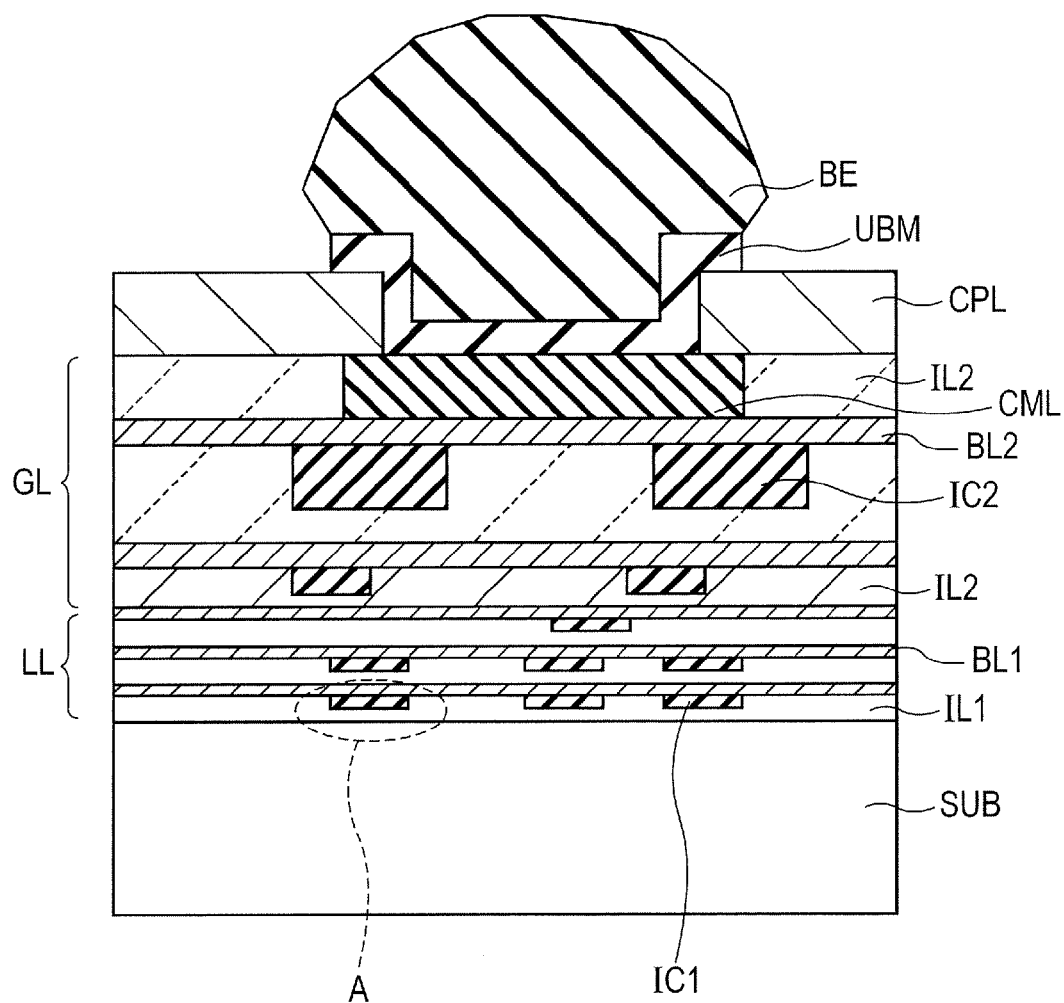
FIG. 1 is a sectional view showing the configuration of a semiconductor device according to a first embodiment.
Figure 3:
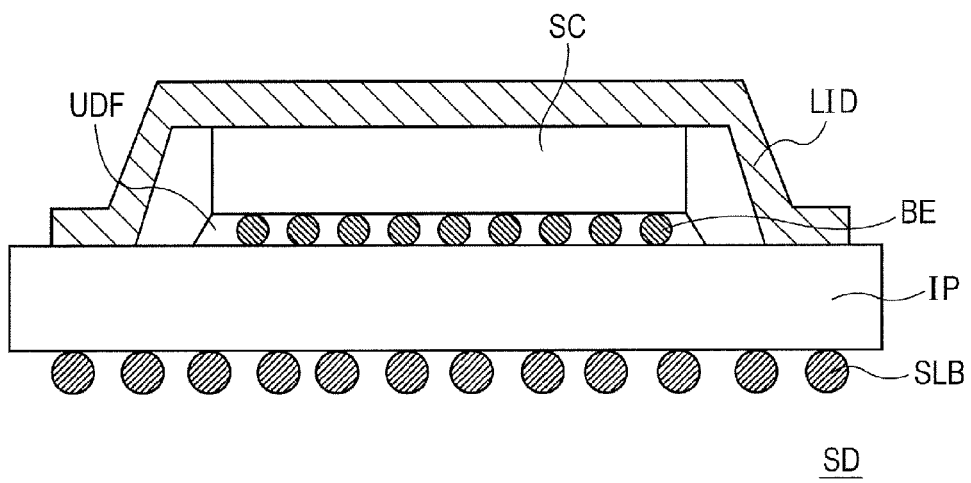
FIG. 3 is a sectional view showing the configuration of the semiconductor device according to the first embodiment.

Referring to FIGS. 1 and 3, the configuration of a semiconductor device SD according to a first embodiment will be described. The semiconductor device SD includes an interlayer insulating film IL1 containing Si, O, C, and H, an under-bump metal film UBM disposed over the interlayer insulating film IL1 and containing Ni, and a bump electrode BE disposed over the under-bump metal film UBM. In the interlayer insulating film IL1, the ratio of the peak height of Si—$CH_3$ near a wave number 1270 $cm^{-1}$ to the peak height of Si—O near a wave number 1030 $cm^{-1}$ is 0.15 or greater and 0.27 or less. The ratio of the peak height of Si—$CH_2$—Si near a wave number 160 cm$^{-1}$ to the peak height of Si—CH$_3$ near the wave number 1270 cm$^{-1}$ is 0.031 or greater. These ratios are obtained by Fourier-transform infrared spectroscopy (FTIR). Detailed description will be made below.

Figure 2:
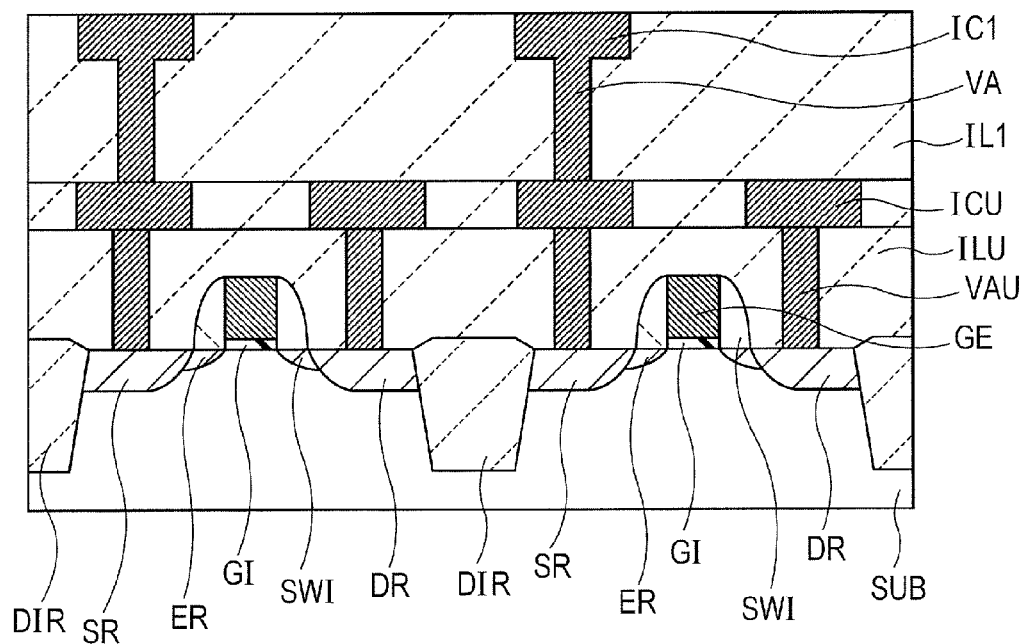
FIG. 2 is an enlarged sectional view of a portion A of FIG. 1.

FIGS. 1 and 3 are sectional views showing the configuration of the semiconductor device SD according to the first embodiment. FIG. 1 shows part of a semiconductor chip SC obtained by dicing. FIG. 2 is an enlarged sectional view of a portion A of FIG. 1. FIG. 3 shows the semiconductor device SD which is packaged.

As shown in FIG. 2, a semiconductor substrate SUB has element isolation regions DIR each having an aperture (no reference sign). Formed at each aperture is, for example, a metal insulator semiconductor field effect transistor (MISFET), as will be described later.

The semiconductor substrate SUB is, for example, a silicon substrate. The element isolation regions DIR are formed of, for example, SiO$_2$. While the element isolation regions DIR are formed, for example, by local oxidation of silicon (LOCOS) herein, they may be formed by shallow trench isolation (STI).

The semiconductor substrate SUB also has source regions SR and drain regions DR at positions which are separated in a plan view. Source-side extension regions ER are formed so as to be in contact with the source regions SR; drain-side extension regions ER are formed so as to be in contact with the drain regions DR.

A gate insulating layer GI is disposed over regions between the extension regions ER. The gate insulating layer GI is formed of, for example, SiO$_2$ or SiON. Alternatively, the gate insulating layer GI may be, for example, a high-permittivity film containing Hf.

Gate electrodes GE are disposed over the gate insulating layer GI. The gate electrodes GE are formed of, for example, polysilicon. Alternatively, the gate electrodes GE may be, for example, Ti, Ta, Mo, alloys thereof, nitrides of these metals, or nitrides of these metals and silicon.

A sidewall insulating film SWI is disposed around the sidewalls of the gate insulating layer GI and the gate electrodes GE. Additionally, a liner insulating film (not shown) may be disposed over the semiconductor substrate SUB, the gate electrodes GE, and the sidewall insulating film SWI.

As shown in FIG. 2, a lower insulating film ILU is disposed over the semiconductor substrate SUB, the element isolation regions DIR, and the gate electrodes GE. The lower insulating film ILU may be formed of a material which differs from the interlayer insulating film IL1 to be discussed later.

The lower insulating film ILU is provided with, for example, contact plugs VAU which are in contact with the source regions SR or drain regions DR. Further, the lower insulating film ILU is provided with contact plugs VAU which are in contact with the gate electrodes GE, in regions which are not shown. The contact plugs VAU contain, for example, tungsten (W). The side and bottom surfaces of the contact plugs VAU may be provided with a barrier metal layer (not shown).

The interlayer insulating film IL1 is disposed over the lower insulating film ILU. The interlayer insulating film IL1 is, for example, a SiCOH film. The interlayer insulating film IL1 is provided with wiring ICU which is installed, for example, by single damascene. The wiring ICU is coupled to the source regions SR, the drain regions DR, or the gate electrodes GE via the contact plugs VAU. The wiring ICU contains copper (Cu).

Multiple interlayer insulating films IL1 are further disposed over the interlayer insulating film IL1. The upper interlayer insulating films IL1 are provided with wiring IC1 and vias VA which are installed, for example, by dual damascene. The wiring IC1 and the vias VA contain Cu. The side and bottom surfaces of the wiring IC1 and the vias VA may be provided with a barrier metal layer (not shown).

As shown in FIG. 1, a multilayer wiring layer is formed over the semiconductor substrate SUB. The multilayer wiring layer includes a local wiring layer LL and a global wiring layer GL. The local wiring layer LL is a wiring layer for forming a circuit; the global wiring layer GL is a wiring layer for routing power supply wiring and ground wiring.

The local wiring layer LL includes the interlayer insulating film IL1. The interlayer insulating film IL1 will be described in detail later. The interlayer insulating film IL1 of the local wiring layer LL is provided with the wiring IC1 or vias (not shown).

Diffusion prevention layers BL1 may be disposed among the wiring layers of the local wiring layer LL. The diffusion prevention layers BL1 are formed of, for example, SiCN, SiC, SiON, SiCO, SiCON, or SiN.

The global wiring layer GL is disposed over the local wiring layer LL. The global wiring layer GL includes an interlayer insulating film IL2. The interlayer insulating film IL2 is formed of, for example, a material having a higher density than the interlayer insulating film IL1. The interlayer insulating film IL2 is formed of, for example, SiO$_2$ or SiOF.

The interlayer insulating film IL2 of the global wiring layer GL is provided with wiring IC2 or vias (not shown). The wiring IC2 is coupled to the wiring IC1 of the local wiring layer LL, for example, through vias. Diffusion prevention layers BL2 may be disposed among the wiring layers of the global wiring layer GL.

In the global wiring layer GL, at least the wiring 102 or vias, which is located below the uppermost layer, is formed by damascene. The wiring 102 and the vias contain Cu.

A metal film CML which is in contact with electrodes (BE, etc.) is disposed in the uppermost layer of the global wiring layer GL. The metal film CML serves as a base for the bump electrode BE. The metal film CML contains, for example, Al. The metal film CML is coupled to the wiring IC2 therebelow via vias.

A protective layer CPL is disposed over the global wiring layer GL. The protective layer CPL is formed of, for example, polyimide. The protective layer CPL has an aperture (no reference sign) at a position which overlaps the metal film CML in a plan view.

The aperture is provided with the under-bump metal film UBM. The under-bump metal film UBM is formed of a material for controlling migration of the material of which the bump electrode BE is formed. Specifically, the under-bump metal film UBM is formed of, for example, Ni.

The bump electrode BE is disposed over the under-bump metal film UBM. The bump electrode BE is formed of a Pb-free solder material. The bump electrode BE contains, for example, Sn and Ag. The height of the bump electrode BE is 50 μm or greater and 100 μm or less. Owing to the above-mentioned configuration of the bump electrode BE, the semiconductor chip SC can be stably flip-chip mounted over a circuit substrate IP. Stress to be applied to the interlayer insulating film IL1 below the bump electrode BE depends on the material of which the bump electrode BE is formed or the height (or volume) of the bump electrode BE. Assuming that at least the bump electrode BE has a composition as described above, the inventors have confirmed that occurrence of defects in the interlayer insulating film IL1 can be controlled if the interlayer insulating film IL1 has a composition to be discussed later. The configuration of the bump electrode BE is not limited to that described above. Even if the bump electrode has other configurations, similar advantageous effects to the first embodiment can be obtained.

As shown in FIG. 3, the semiconductor device SD is, for example, a ball grid array (BGA) package. The semiconductor chip SC is mounted over the circuit substrate IP, for example, by flip-chip mounting. An under-fill resin UDF is injected between the semiconductor chip SC and the circuit substrate IP.

A lid LID having a recess is disposed over the circuit substrate IP and the semiconductor chip SC. The perimeter of the lid LID is in contact with the circuit substrate IP. The inner surface of the recess of the lid LID is in contact with the top surface of the semiconductor chip SC. The lid LID is fixed to the circuit substrate IP and the semiconductor chip SC using an adhesive (not shown). Solder balls SLB are disposed under the bottom surface of the circuit substrate IP.

The package of the semiconductor device SD need not necessarily be of BGA type and may be of other types.

Figure 4:
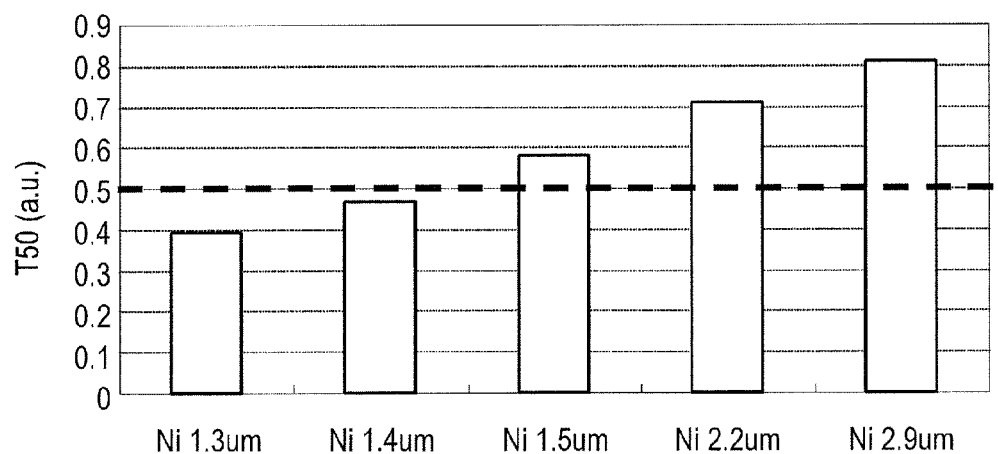
FIG. 4 is a diagram showing the thickness of an under-bump metal film versus the electromigration lifetime.

Referring now to FIG. 4, the thickness of the under-bump metal film UBM will be described. FIG. 4 is a diagram showing the thickness of the under-bump metal film UBM versus the electromigration lifetime. FIG. 4 shows results of electromigration tests performed on multiple semiconductor devices SD including under-bump metal films UBM having different thicknesses under predetermined conditions.

The horizontal axis of FIG. 4 represents the thickness of the under-bump metal film UBM containing Ni. The vertical axis of FIG. 4 represents, in any unit (a.u.), the time (T50) when the number of samples in which defects occurred due to electromigration became 50% of the total number of samples of each semiconductor device SD subjected to the test. A thick dotted line represents a reliability criterion for predetermined products.

As shown in FIG. 4, as the thickness of the under-bump metal film UBM increases, the electromigration lifetime (T50) tends to increase. In the under-bump metal film UBM having a small thickness, the material of which the under-bump metal film UBM is formed is prone to migrate during the test. As a result, voids occur in the under-bump metal film UBM. Accordingly, the under-bump metal film UBM having a smaller thickness has a shorter electromigration lifetime. In contrast, the under-bump metal film UBM having a larger thickness has a larger volume than when it has a smaller thickness. Accordingly, a change in resistance associated with occurrence of voids is small. The under-bump metal film UBM having a larger thickness has a longer electromigration lifetime.

In the first embodiment, the thickness of the under-bump metal film UBM is, for example, 1.5 μm or greater and 3.0 μm or less. If the thickness of the under-bump metal film UBM is 1.5 μm or greater, the electromigration lifetime can be made equal to or longer than the reliability criterion for predetermined products. If the thickness of the under-bump metal film UBM is 3.0 μm or less, the contact resistance between the bump electrode BE and the metal film CML below the bump electrode BE can be reduced.

On the other hand, the inventors have found that when the under-bump metal film UBM has a large thickness, stress applied to the bump electrode BE causes defects as described below in the interlayer insulating film IL1 below the bump electrode BE. The under-bump metal film UBM is formed of a harder material than the bump electrode BE. For example, when stress is applied to the bump electrode BE during or after the mounting process, the under-bump metal film UBM does not relax the stress. Thus, the stress is also applied to the interlayer insulating film IL1. At this time, defects such as cracks may occur in the interlayer insulating film IL1 below the bump electrode BE.

For example, if the interlayer insulating film IL1 has a low strength, cracks may occur even when the thickness of the under-bump metal film UBM is 1.5 μm or greater. Further, as the thickness of the under-bump metal film UBM increases, the incidence of defects in the interlayer insulating film IL1 tends to increase.

As seen above, it is difficult to both control the migration of the material of which the bump electrode BE is formed and control the occurrence of defects in the interlayer insulating film IL1.

In view of the foregoing, in the interlayer insulating film IL1 according to the first embodiment, a ratio Si—$CH_3$/Si—O and a ratio Si—$CH_2$—Si/Si—$CH_3$ fall within predetermined ranges, respectively. These ratios are obtained by FTIR and will be described later. Thus, an interlayer insulating film having a high strength can be obtained. Further, even when the thickness of the under-bump metal film UBM is 1.5 μm or greater and 3.0 μm or less, it is possible to reduce the incidence of defects such as cracks that occur in the interlayer insulating film below the bump electrode BE due to stress applied to the bump electrode BE.

Next, characteristics of the interlayer insulating film IL1 according to the first embodiment will be described in detail. The interlayer insulating film IL1 contains silicon (Si), oxygen (O), carbon (C), and hydrogen (H). The interlayer insulating film IL1 is not a porous film. Hereafter, a film used as the interlayer insulating film IL1 will be referred to as "SiCOH film".

In the first embodiment, the relative permittivity of the SiCOH film used as the interlayer insulating film IL1 is 2.5 or greater and 3.2 or less. Thus, the inter-wiring capacity can be reduced.

To obtain a SiCOH film having relative permittivity as described above, the interlayer insulating film IL1 needs to have not less than a predetermined carbon (C) atom content. The inventors have found that the SiCOH film meeting the above-mentioned relative permittivity has characteristics as described below in an FTIR spectrum. Specifically, the ratio of the peak height of Si—$CH_3$ near a wave number 1270 $cm^{-1}$ to the peak height of Si—O near a wave number 1030 $cm^{-1}$ (the ratio Si—$CH_3$/Si—O) obtained by FTIR is 0.15 or greater and 0.27 or less. Thus, the interlayer insulating film IL1 having relative permittivity of 2.5 or greater and 3.2 or less can be obtained.

Further, the inventors have found that a SiCOH film having a high strength (breakdown voltage to be discussed later) can be obtained in a range as described below, from an FTIR spectrum. Specifically, the ratio of the peak height of Si—$CH_2$—Si near a wave number 1360 $cm^{-1}$ to the peak height of Si—$CH_3$ near the wave number 1270 $cm^{-1}$ (the ratio Si—$CH_2$—Si/Si—$CH_3$) obtained by FTIR is 0.031 or greater. Detailed description will be made below.

In the following description, of SiCOH films having relative permittivity of 2.5 or greater and 3.2 or less, a film having a lower strength are referred to as "a comparative example"; and a film having a higher strength as "a first embodiment".

Figure 5:
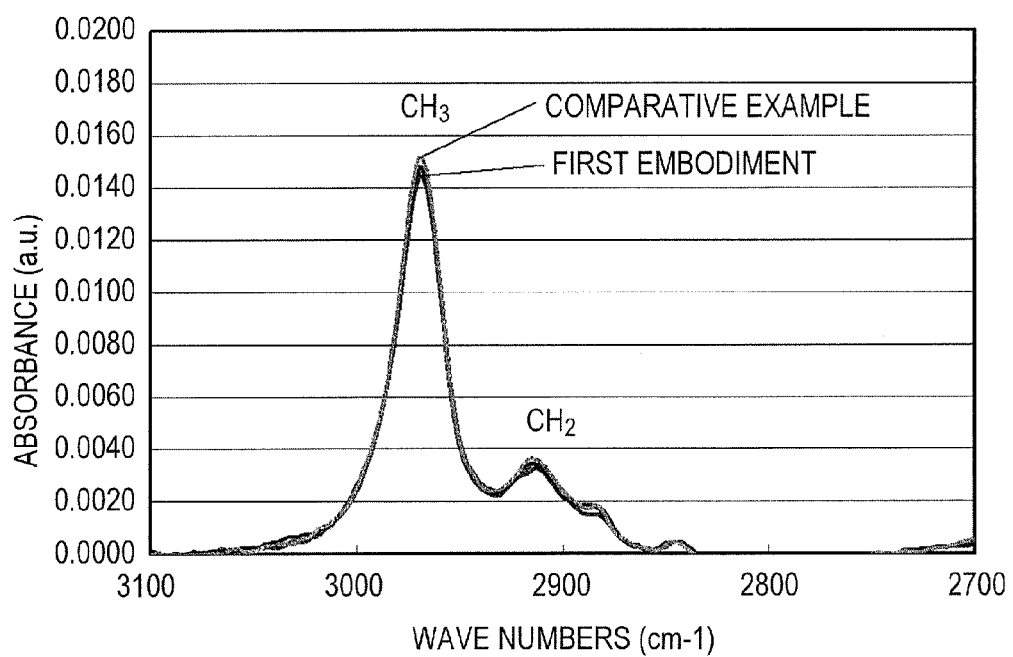
FIG. 5 is a graph showing wave numbers 2700 $cm^{-1}$ or greater and 3100 $cm^{-1}$ or less versus FTIR spectrums of SiCOH films.
Figure 6:
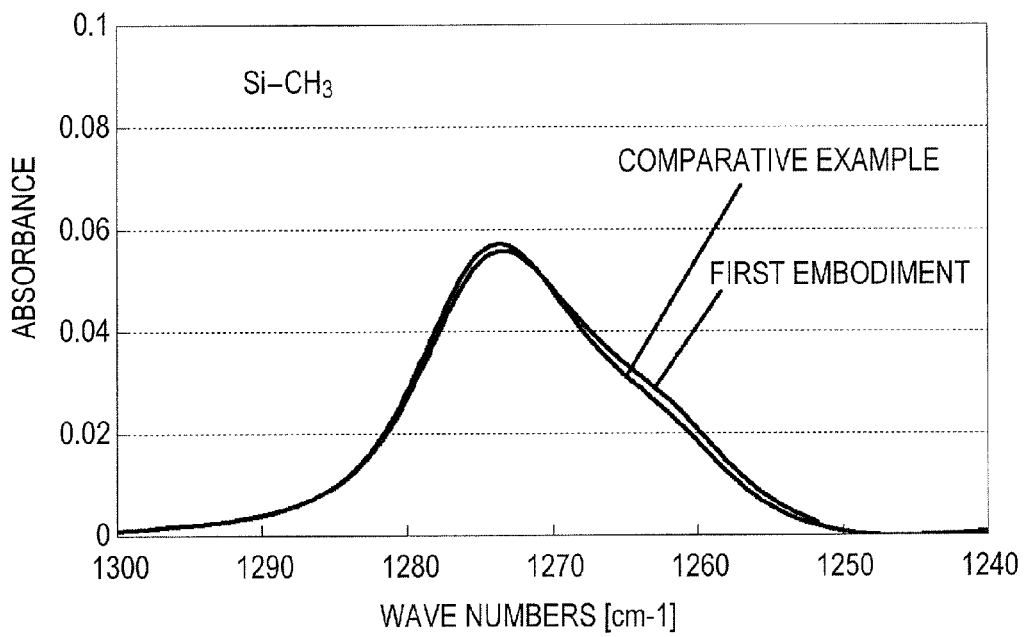
FIG. 6 is a graph showing wave numbers 1240 $cm^{-1}$ or greater and 1300 $cm^{-1}$ or less versus FTIR spectrums of the SiCOH films.
Figure 7:
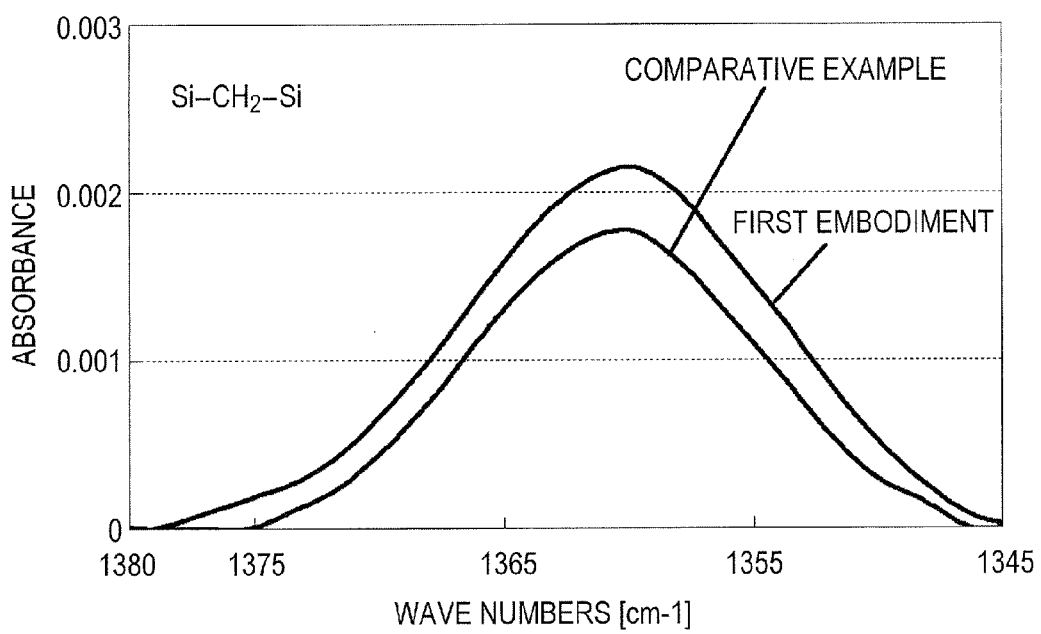
FIG. 7 is a graph showing wave numbers 1345 $cm^{-1}$ or greater and 1380 $cm^{-1}$ or less versus FTIR spectrums of the SiCOH films.

FIGS. 5 to 7 show results of FTIR measurements conducted on monolayer SiCOH films. FIG. 5 is a graph showing wave numbers 2700 $cm^{-1}$ or greater and 3100 $cm^{-1}$ or less versus FTIR spectrums of the SiCOH films. As shown in FIG. 5, peaks derived from $CH_2$ or $CH_3$ are found near the wave number 2950 $cm^{-1}$. In this graph, the peak shape of $CH_2$ or $CH_3$ of the first embodiment is approximately the same as that of the comparative example.

FIG. 6 shows a graph showing wave numbers 1240 cm$^{-1}$ or greater and 1300 cm$^{-1}$ or less versus FTIR spectrums of the SiCOH films. As shown in FIG. 6, peaks derived from Si—CH$_3$ are found near the wave number 1270 cm$^{-1}$. In this graph, the peak shape of Si—CH$_3$ of the first embodiment is approximately the same as that of the comparative example.

FIG. 7 shows a graph showing wave numbers 1345 cm$^{-1}$ or greater and 1380 cm$^{-1}$ or less versus FTIR spectrums of the SiCOH films. As shown in FIG. 7, peaks derived from Si—CH$_2$—Si are found near the wave number 1360 cm$^{-1}$.

The peak derived from Si—CH$_2$—Si near the wave number 1360 cm$^{-1}$ is not found in the dielectric film disclosed in the above-mentioned Japanese Unexamined Patent Publication (Translation of PCT Application) No. 2008-530821 (see, for example, FIG. 7 of that Publication).

For the peak of Si—CH$_2$—Si, there is a clear difference between the first embodiment and the comparative example. The peak height of Si—CH$_2$—Si of the first embodiment is higher than that of the comparative example. The inventors have found that the peak height of Si—CH$_2$—Si is correlated to the strength of the SiCOH film.

Figure 8:
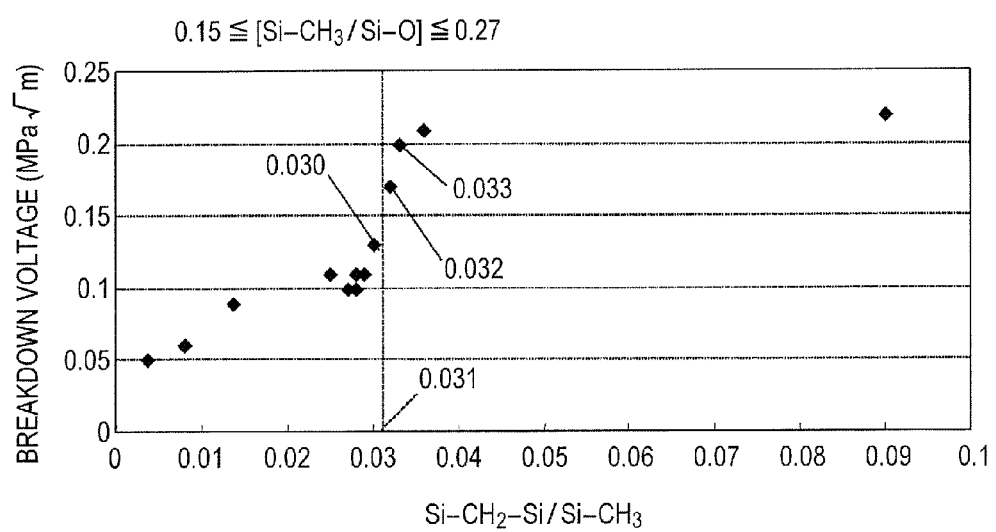
FIG. 8 is a diagram showing the ratio Si—$CH_2$—Si/Si—$CH_3$ when the ratio Si—$CH_3$/Si—O is 0.15 or greater and 0.27 or less versus the breakdown voltages of the SiCOH films.

FIG. 8 is a graph showing the ratio Si—CH$_2$—Si/Si—CH$_3$ when the ratio Si—CH$_3$/Si—O is 0.15 or greater and 0.27 or less versus the breakdown voltage of the SiCOH film.

The horizontal axis of FIG. 8 represents the ratio of the peak height of Si—CH$_2$—Si near a wave number 1360 cm$^{-1}$ to the peak height of Si—CH$_3$ near a wave number 1270 cm$^{-1}$ (the ratio Si—CH$_2$—Si/Si—CH$_3$) obtained by FTIR. This peak height ratio is obtained from a spectrum from which the background has been eliminated, of spectrums detected by FTIR. Note that the ratio is not a peak area ratio. Values given to plotted points represent the values of Si—CH$_2$—Si/Si—CH$_3$ at these points.

The vertical axis of FIG. 8 represents breakdown voltages K$_c$ of SiCOH films measured by nanoindentation (in units of MPa·m$^{1/2}$). The breakdown voltages K$_c$ are measured using a nanoindenter. Monolayer SiCOH films are used in the measurements.

A breakdown voltage K$_c$ (units of MPa·m$^{1/2}$) can be obtained by Formula (1) below.

[Formula 1]
$$K_c = \alpha \left(\frac{E}{H}\right)^{1/2} \left(\frac{P}{c^{3/2}}\right) \quad (1)$$

In Formula (1), α represents a constant for the nanoindenter and is 0.016 for a Berkovich indenter; E represents the Young's modulus of the SiCOH film; H represents the hardness of the SiCOH film; P represents the maximum load of the nanoindenter; and c represents the length of a crack that occurs in the SiCOH film indented using the nanoindenter.

The SiCOH film shown as the comparative example in FIGS. 5 to 7 is one of films having a ratio Si—CH$_2$—Si/Si—CH$_3$ of less than 0.031 in FIG. 8. On the other hand, the SiCOH film shown as the first embodiment is one of films having a ratio Si—CH$_2$—Si/Si—CH$_3$ of 0.031 or greater.

As shown in FIG. 8, as the ratio Si—CH$_2$—Si/Si—CH$_3$ increases, the breakdown voltage of the SiCOH film increases. The breakdown voltage sharply increases after the ratio Si—CH$_2$—Si/Si—CH$_3$ reaches 0.031. The breakdown voltage is higher when the ratio Si—CH$_2$—Si/Si—CH$_3$ is 0.031 or greater than when the ratio is less than 0.031.

Figure 9A:
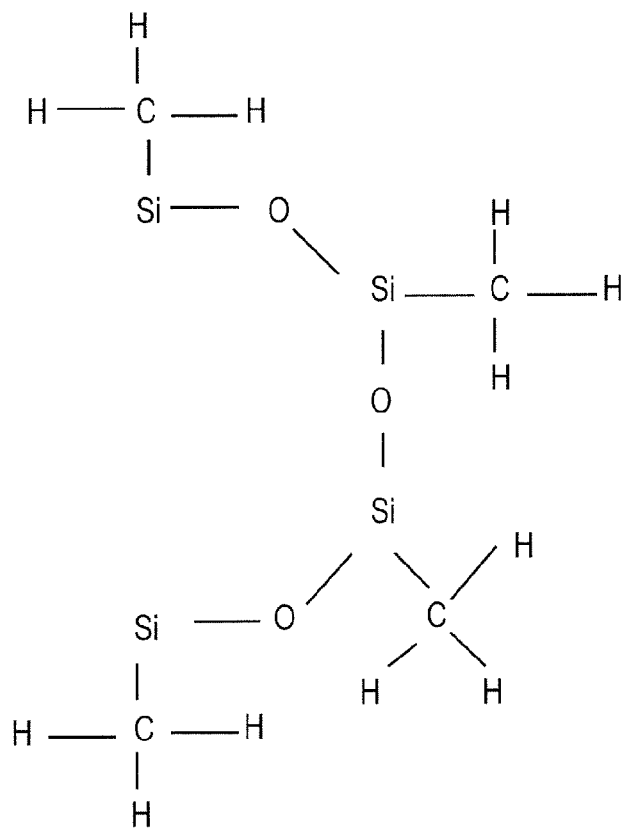
FIGS. 9A and 9B are schematic diagrams showing bonds in a SiCOH film.
Figure 9B:
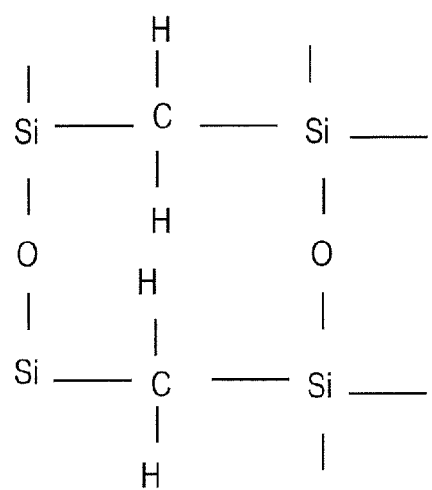

Referring now to FIGS. 9A and 9B, a mechanism where the breakdown voltage increases as Si—CH$_2$—Si increases will be described. FIGS. 9A and 9B are schematic diagrams showing bonds in a SiCOH film. FIG. 9A shows a Si—CH$_3$ bonding model. FIG. 9B shows a Si—CH$_2$—Si bonding model.

In a SiCOH film where Si—CH$_3$ bonds as shown in FIG. 9A are dominant, for example, a methyl group derived from a Si raw material is coordinated to Si and terminated. Accordingly, Si atoms are bonded weakly in the SiCOH film where Si—CH$_3$ bonds are dominant.

As shown in FIG. 9B, on the other hand, adjacent Si atoms are cross-linked with CH$_2$ therebetween in a SiCOH film containing Si—CH$_2$—Si bonds. Thus, a strong, stable SiCOH film can be obtained. This is considered to be the reason why when the ratio Si—CH$_2$—Si/Si—CH$_3$ is 0.031 or greater, the breakdown voltage is high.

As seen above, in the SiCOH film used as the interlayer insulating film IL1 according to the first embodiment, the ratio Si—CH$_2$—Si/Si—CH$_3$ obtained by FTIR is 0.031 or greater. Thus, the interlayer insulating film IL1 having a high strength can be obtained. As a result, it is possible to reduce the incidence of defects such as cracks that occur in the interlayer insulating film IL1 below the bump electrode BE.

In the semiconductor device SD, at least the interlayer insulating film IL1, which is included in the local wiring layer LL, preferably has the above-mentioned ratio Si—CH$_2$—Si/Si—CH$_3$. The interlayer insulating film IL2 included in the global wiring layer GL may also have the above-mentioned ratio Si—CH$_2$—Si/Si—CH$_3$.

Referring again to FIGS. 1 and 3, a method for manufacturing the semiconductor device SD according to the first embodiment will be described. The method for manufacturing the semiconductor device SD according to the first embodiment includes the following steps. The interlayer insulating film IL1 containing Si, O, C, and H is formed (interlayer insulating film formation step). The under-bump metal film UBM containing Ni is formed over the interlayer insulating film IL1. The bump electrode BE is formed over the under-bump metal film UBM. In the interlayer insulating film formation step, the interlayer insulating film IL1 is formed in such a manner that the ratio of the peak height of Si—CH$_3$ near the wave number 1270 cm$^{-1}$ to the peak height of Si—O near the wave number 1030 cm$^{-1}$ is 0.15 or greater and 0.27 or less and that the ratio of the peak height of Si—CH$_2$—Si near the wave number 1360 cm$^{-1}$ to the peak height of Si—CH$_3$ near the wave number 1270 cm$^{-1}$ is 0.031 or greater. Detailed description will be made below.

First, as shown in FIG. 2, the element isolation regions DIR each having an aperture are formed in the semiconductor substrate SUB. Subsequently, the gate insulating layer GI and the gate electrodes GE are formed over the semiconductor substrate SUB. Subsequently, ion implantation is performed using the gate insulating layer GI and the gate electrodes GE as masks to form the extension region ERs. Subsequently, the sidewall insulating film SWI is formed around the respective sidewalls of the gate insulating layer GI and the gate electrodes GE. Subsequently, ion implantation is performed using the sidewall insulating film SWI, the gate insulating layer GI, and the gate electrodes GE as masks to form the source regions SR and the drain regions DR.

Subsequently, the lower insulating film ILU is formed over the semiconductor substrate SUB, the element isolation regions DIR, the sidewall insulating film SWI, and the gate electrodes GE, for example, by chemical vapor deposition (CVD). Subsequently, contact holes (no reference sign) are formed in the lower insulating film ILU. Subsequently, a metal film containing W is formed in the contact holes and over the lower insulating film ILU, for example, by CVD. Subsequently, the top of the lower insulating film ILU is flattened by chemical mechanical polishing (CMP). Thus, the contact plugs VAU are formed in the lower insulating film ILU.

Subsequently, as shown in FIG. 1, the local wiring layer LL including the wiring IC1 and vias is formed. At this time, the interlayer insulating film IL1 containing Si, O, C, and H is formed as described below (interlayer insulating film formation step).

In the interlayer insulating film formation step, a SiCOH film is formed as the interlayer insulating film IL1, for example, by parallel plate-type plasma CVD. Examples of a Si raw material include, but not limited to, trimethylsilane. The Si raw material may be tetramethylsilane, tetraethyl orthosilicate (TEOS), or the like.

The film forming condition in the interlayer insulating film formation step is preferably a low pressure or high power. Thus, power efficiency with respect to the Si raw material is increased. At this time, hydrocarbon groups in the Si raw material are decomposed to form Si—$CH_2$—Si bonds. Accordingly, forming the interlayer insulating film IL1 under low pressure or with high power can facilitate the formation of Si—$CH_2$—Si bonds.

Further, preferably, the ratio of the flow rate of the Si raw material to the total gas flow rate is high. Thus, the possibility that carbon (C) atoms will be absorbed can be increased. Additionally, the semiconductor substrate SUB may be heated during film formation.

By adjusting the conditions in the interlayer insulating film formation step, the interlayer insulating film IL1 is formed where the ratio Si—$CH_3$/Si—O is 0.15 or greater and 0.27 or less and the ratio Si—$CH_2$—Si/Si—$CH_3$ is 0.031 or greater.

Subsequently, as shown in FIG. 1, via holes (not shown) or wiring grooves (not shown) are formed in the interlayer insulating film IL1. Subsequently, a barrier metal layer (not shown) is formed around the side and bottom surfaces of the via holes or wiring grooves and over the interlayer insulating film IL1. Subsequently, vias (not shown) or the wiring IC1 are formed over the barrier metal layer, for example, by plating. As seen above, the wiring layer is formed by damascene.

By repeating a similar method to what is described above, the local wiring layer LL is formed. Diffusion prevention layers BL1 may be disposed among the wiring layers of the local wiring layer LL.

Subsequently, the interlayer insulating film IL2 is formed over the interlayer insulating film IL1 of the local wiring layer LL, for example, by CVD. Vias or the wiring IC2 are formed by damascene. In this way, the global wiring layer GL is formed over the local wiring layer LL. Diffusion prevention layers BL2 may be formed among the wiring layers of the global wiring layer GL.

Subsequently, the metal film CML containing Al is formed in the uppermost layer of the global wiring layer GL. Subsequently, the protective layer CPL is formed over the global wiring layer GL. Subsequently, an aperture (no reference sign) is formed at a position which overlaps the metal film CML in a plan view, of the protective layer CPL.

Subsequently, the under-bump metal film UBM is formed at the aperture, for example, by sputtering. At this time, the under-bump metal film UBM is formed with a thickness of, for example, 1.5 µm or greater and 3.0 µm or less.

Subsequently, the bump electrode BE containing Sn and Ag is formed over the under-bump metal film UBM, for example, by plating. Alternatively, the bump electrode BE may be formed by printing. Subsequently, reflow is performed. Thus, the spherical bump electrode BE is formed. Subsequently, the semiconductor substrate SUB is diced into semiconductor chips SC.

Subsequently, as shown in FIG. 3, a semiconductor chip SC is mounted over the circuit substrate IP (mounting step). In the mounting step, the semiconductor chip SC is heat crimped onto the circuit substrate IP. Thus, the bump electrode BE of the semiconductor chip SC is coupled to a terminal (not shown) of the circuit substrate IP.

Subsequently, the under fill resin UDF is injected between the semiconductor chip SC and the circuit substrate IP. Subsequently, the lid LID having a recess is bonded to the circuit substrate IP and the semiconductor chip SC. Subsequently, the solder balls SLB are formed under the bottom surface of the circuit substrate IP.

In this way, the semiconductor device SD according to the first embodiment can be obtained.

Now, advantageous effects of the first embodiment will be described in comparison with a comparative example.

As a comparative example, a semiconductor device is considered where the relative permittivity of the interlayer insulating film IL1 is the same as that in the first embodiment but the ratio Si—$CH_2$—Si/Si—$CH_3$ of the interlayer insulating film IL1 is less than 0.031. As described above, the comparative example has a low breakdown voltage. For this reason, in the comparative example, cracks may occur in the interlayer insulating film IL1 below the bump electrode BE due to a load which is imposed, for example, when heat crimping the bump electrode BE in the mounting step. Such cracks may also occur when thermal stress is applied to the bump electrode due to the difference in thermal expansion between the semiconductor substrate SUB and the circuit substrate IP after mounting.

On the other hand, in the interlayer insulating film IL1 according to the first embodiment, the ratio Si—$CH_3$/Si—O is 0.15 or greater and 0.27 or less. The ratio Si—$CH_2$—Si/Si—$CH_3$ is 0.031 or greater. These ratios are obtained by FTIR.

Thus, as shown in FIG. 8, when the ratio Si—$CH_2$—Si/Si—$CH_3$ of the interlayer insulating film IL1 is 0.031 or greater, the breakdown voltage can be increased. It is therefore possible to reduce the incidence of defects such as cracks that occur in the interlayer insulating film IL1 due to stress applied to the bump electrode BE, regardless of the thickness of the under-bump metal film UBM.

As seen above, according to the first embodiment, the semiconductor device SD can be provided that includes the interlayer insulating film IL1 having a high strength.

Second Embodiment

A second embodiment is similar to the first embodiment except that the ratio Si—$CH_3$/Si—O and the ratio Si—$CH_2$—Si/Si—$CH_3$ of the interlayer insulating film IL1 fall within further limited ranges, respectively. Detailed description will be made below.

The inventors have found that when the ratio Si—$CH_3$/Si—O and the ratio Si—$CH_2$—Si/Si—$CH_3$ fall within the respective further limited ranges, the interlayer insulating film IL1 having a significantly high strength can be obtained. Specifically, in the interlayer insulating film IL1, the ratio of the peak height of Si—$CH_3$ near the wave number 1270 $cm^{-1}$ to the peak height of Si—O near the wave number 1030 $cm^{-1}$ is 0.16 or greater and 0.24 or less. The ratio of the peak height of Si—$CH_2$—Si near the wave number 1360 $cm^{-1}$ to the peak height of Si—$CH_3$ near the wave number 1270 $cm^{-1}$ is 0.033 or greater. These ratios are obtained by FTIR. Detailed description will be made below.

Note that in the second embodiment, the relative permittivity of a SiCOH film used as the interlayer insulating film IL1 is 2.9 or greater and 3.15 or less.

Figure 10:
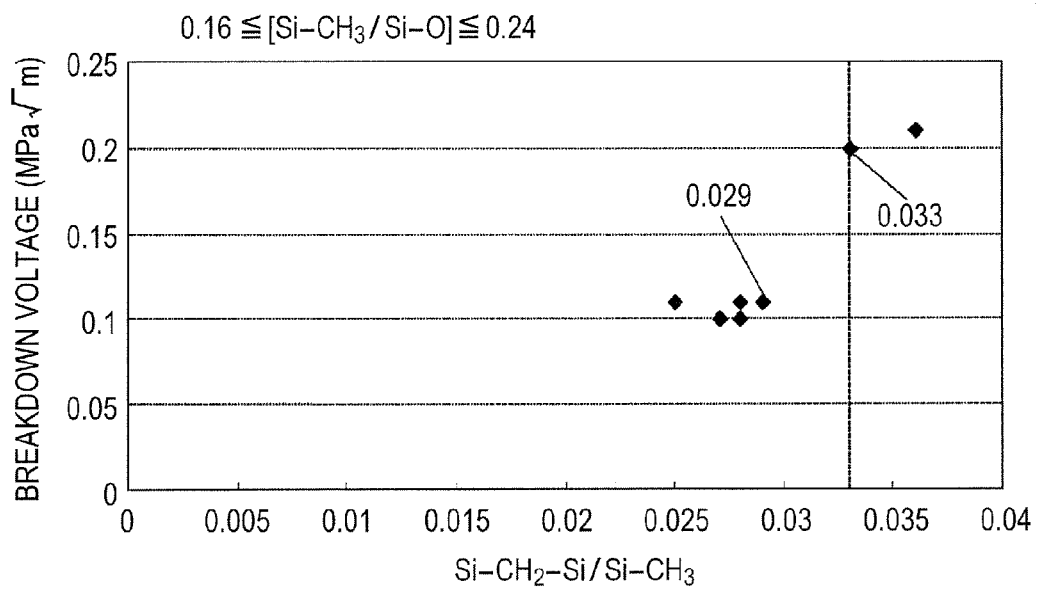
FIG. 10 is a graph showing the ratio Si—$CH_2$—Si/Si—$CH_3$ when the ratio Si—$CH_3$/Si—O is 0.16 or greater and 0.24 or less versus the breakdown voltage.

FIG. 10 is a diagram showing the ratio Si—$CH_2$—Si/Si—$CH_3$ when the ratio Si—$CH_3$/Si—O is 0.16 or greater and 0.24 or less versus the breakdown voltage. As shown in FIG. 10, the breakdown voltage is significantly higher when the ratio Si—$CH_2$—Si/Si—$CH_3$ is 0.033 or greater than when the ratio is 0.029 or less. Specifically, the breakdown voltage when the ratio Si—$CH_2$—Si/Si—$CH_3$ is 0.033 or greater is approximately twice or more that when the ratio is 0.029 or less.

Figure 11:
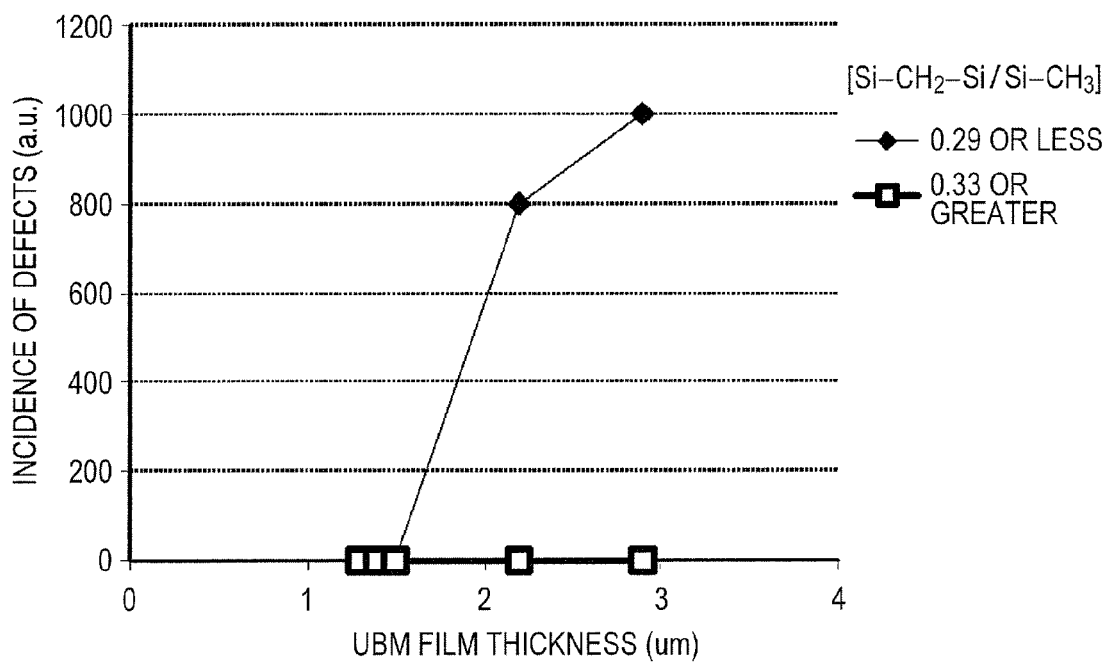
FIG. 11 is a graph showing the thickness of an under-bump metal film versus the incidence of defects that occurred in an interlayer insulating film.

FIG. 11 is a graph showing the thickness of the under-bump metal film UBM versus the incidence of defects that occur in the interlayer insulating film IL1. The horizontal axis of FIG. 11 represents the thickness (μm) of the under-bump metal film UBM of the semiconductor device SD. The vertical axis of FIG. 11 represents the incidence of defects that occurred in the interlayer insulating film IL1 which is subjected to a predetermined thermal cycle test. As described above, the term "defects" refer to cracks that occur in the interlayer insulating film IL1 below the bump electrode BE when thermal stress is applied to the bump electrode.

In FIG. 11, black diamond marks represent results of semiconductor devices SD of the comparative examples where the ratio Si—$CH_2$—Si/Si—$CH_3$ of the interlayer insulating film IL1 is 0.029 or less. Open rectangular marks represent results of semiconductor devices SD of the second embodiment where the ratio Si—$CH_2$—Si/Si—$CH_3$ of the interlayer insulating film IL1 is 0.033 or greater. The under-bump metal film UBM contains Ni.

As shown in FIG. 11, in the semiconductor devices SD of the comparative examples where the ratio Si—$CH_2$—Si/Si—$CH_3$ of the interlayer insulating film IL1 is 0.029 or less, the incidence of defect tends to increase as the thickness of the under-bump metal film UBM increases.

As shown in FIG. 4, for the electromigration lifetime to meet the reliability criterion for predetermined products, the thickness of the under-bump metal film UBM needs to be 1.5 μm or greater. However, as shown in FIG. 11, in the comparative examples, cracks can occur in the interlayer insulating film IL1 even when the thickness of the under-bump metal film UBM is 1.5 μm or greater.

On the other hand, in the semiconductor devices SD of the second embodiment where the ratio Si—$CH_2$—Si/Si—$CH_3$ of the interlayer insulating film IL1 is 0.033 or greater, the incidence of defects is 0, regardless of the thickness of the under-bump metal film UBM. That is, when the under-bump metal film UBM has a thickness which allows the electromigration lifetime to meet the reliability criterion for predetermined products, defects such as cracks do not occur in the interlayer insulating film below the bump electrode BE. Accordingly, in the second embodiment, it is possible to control the migration of the material of which the bump electrode BE is formed, as well as to significantly control the occurrence of defects in the interlayer insulating film IL1.

A method for manufacturing the semiconductor device SD according to the second embodiment is similar to that according to the first embodiment except that the film forming conditions in the interlayer insulating film formation step fall within further limited ranges.

In the interlayer insulating film formation step according to the second embodiment, the interlayer insulating film IL1 is formed, for example, under the following conditions. Specifically, the pressure is, for example, 2 Torr or greater and 4 Torr or less. The RF power is 500 W or greater and 1500 W or less. Note that the power depends on the apparatus and therefore is not limited to the above-mentioned range. The ratio of the flow rate of the Si raw material to the total gas flow rate is 0.5 or greater and 0.7 or less. The substrate temperature is 330° C. or higher and 400° C. or lower.

According to the second embodiment, similar advantageous effects to those of the first embodiment can be obtained. Further, according to the second embodiment, it is possible to significantly control the occurrence of defects such as cracks in the interlayer insulating film below the bump electrode BE, regardless of the thickness of the under-bump metal film UBM.

While the present invention has been described in detail based on the embodiments, the invention is not limited thereto. As a matter of course, various changes can be made to the embodiments without departing from the spirit and scope of the invention.

What is claimed is:

1. A semiconductor device comprising:
    an interlayer insulating film containing Si, O, C, and H;
    an under-bump metal film containing Ni disposed over the interlayer insulating film; and
    a bump electrode disposed over the under-bump metal film,
    wherein in the interlayer insulating film, a ratio of a peak height of Si—$CH_3$ near a wave number 1270 $cm^{-1}$ to a peak height of Si—O near a wave number 1030 $cm^{-1}$ is 0.15 or greater and 0.27 or less, and a ratio of a peak height of Si—$CH_2$—Si near a wave number 1360 $cm^{-1}$ to a peak height of Si—$CH_3$ near the wave number 1270 $cm^{-1}$ is 0.031 or greater, the ratios being obtained by Fourier transform infrared spectroscopy (FTIR).

2. The semiconductor device according to claim 1,
    wherein the ratio of the peak height of Si—$CH_3$ to the peak height of Si—O is 0.16 or greater and 0.24 or less, and
    wherein the ratio of the peak height of Si—$CH_2$—Si to the peak height of Si—$CH_3$ is 0.033 or greater.

3. The semiconductor device according to claim 1,
    wherein a thickness of the under-bump metal film is 1.5 μm or greater and 3.0 μm or less.

4. The semiconductor device according to claim 1,
    wherein the bump electrode contains Sn and Ag.

5. The semiconductor device according to claim 1,
    wherein a height of the bump electrode is 50 μm or greater and 100 μm or less.

6. The semiconductor device according to claim 1,
    wherein relative permittivity of the interlayer insulating film is 2.5 or greater and 3.2 or less.

7. A method for manufacturing a semiconductor device, comprising the steps of:
    forming an interlayer insulating film containing Si, O, C, and H;
    forming an under-bump metal film containing Ni over the interlayer insulating film; and
    forming a bump electrode over the under-bump metal film,
    wherein in the step of forming the interlayer insulating film, a ratio of a peak height of Si—$CH_3$ near a wave number 1270 $cm^{-1}$ to a peak height of Si—O near a wave number 1030 $cm^{-1}$ is 0.15 or greater and 0.27 or less, and a ratio of a peak height of Si—$CH_2$—Si near a wave number 1360 $cm^{-1}$ to a peak height of Si—$CH_3$ near the wave number 1270 $cm^{-1}$ is 0.031 or greater, the ratios being obtained by Fourier transform infrared spectroscopy (FTIR).

8. The method for manufacturing a semiconductor device according to claim 7,
    wherein in the step of forming the under-bump metal film, a thickness of the under-bump metal film is 1.5 μm or greater and 3.0 μm or less.

* * * * *